(12) United States Patent
Kwon

(10) Patent No.: US 8,369,174 B2
(45) Date of Patent: Feb. 5, 2013

(54) POWER UP SIGNAL GENERATION CIRCUIT

(75) Inventor: Kyoung Hwan Kwon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 372 days.

(21) Appl. No.: 12/843,883

(22) Filed: Jul. 27, 2010

(65) Prior Publication Data

US 2011/0026335 A1 Feb. 3, 2011

(30) Foreign Application Priority Data

Jul. 31, 2009 (KR) .................... 10-2009-0070763

(51) Int. Cl.
*G11C 5/14* (2006.01)

(52) U.S. Cl. .................... 365/226; 327/142; 327/143
(58) Field of Classification Search ............. 365/189.09, 365/226; 327/142, 143
See application file for complete search history.

(56) References Cited

U.S. PATENT DOCUMENTS

| 6,847,240 B1 * | 1/2005 | Zhou | 327/143 |
| 6,914,461 B2 * | 7/2005 | Kwon | 327/143 |
| 7,436,226 B2 | 10/2008 | Kim | |
| 7,443,231 B2 * | 10/2008 | Chang | 327/539 |

FOREIGN PATENT DOCUMENTS

| KR | 1020050059704 A | 6/2005 |
| KR | 10-2008-0000219 A | 1/2008 |

* cited by examiner

*Primary Examiner* — VanThu Nguyen
(74) *Attorney, Agent, or Firm* — William Park & Associates Ltd.

(57) ABSTRACT

A power-up signal generation circuit includes a fixed level transition voltage generation unit, a variable level transition voltage generation unit, a comparison unit, and a selective output unit. The fixed level transition voltage generation unit is configured to generate a fixed level transition voltage changing at a constant level of an external voltage. The variable level transition voltage generation unit is configured to generate a variable level transition voltage changing at a level of an external voltage which varies depending on temperature. The comparison unit is configured to compare the level of the fixed level transition voltage with the level of the variable level transition voltage, and generate a selection signal. The selective output unit is configured to output the fixed level transition voltage or the variable level transition voltage as a power-up signal in response to the selection signal.

16 Claims, 3 Drawing Sheets

POWER UP SIGNAL GENERATION CIRCUIT

CROSS-REFERENCES TO RELATED APPLICATIONS

The present application claims priority under 35 U.S.C. 119(a) to Korean application number 10-2009-0070763, filed on Jul. 31, 2009, in the Korean Intellectual Property Office, which is incorporated herein by reference in its entirety.

BACKGROUND

In general, a semiconductor memory device is designed to operate with an external voltage (VDD). The voltage level of an external voltage (VDD) supplied to a semiconductor memory device would rise from 0 V to a target voltage level at a predetermined slope. This could cause malfunction when an external voltage (VDD) is supplied directly to a semiconductor memory device.

Therefore, a semiconductor memory device includes a power-up signal generation circuit which performs an initialization operation during a period of which an external voltage (VDD) rises up to a target voltage level and thereafter enables the semiconductor memory device to operate with the external voltage (VDD) after the external voltage (VDD) rises up to the target voltage level. The power-up signal generation circuit generates a power-up signal, which changes from a low level to a high level (or from a high level to a low level in some embodiments) after the completion of the "power-up period" during which the external voltage (VDD) rises up to the target voltage level. After the power-up signal generated from the power-up signal generation circuit changes to a high level, the semiconductor memory device completes the initialization operation and starts a normal operation.

For a MOS transistor in a semiconductor memory device, its threshold voltage would rise for lower inside temperature of the semiconductor memory device, and, for situations like this, a higher level external voltage (VDD) must be supplied to the MOS transistor. This means that the level transition of power-up signal from low to high must be performed at a higher voltage level of the external voltage VDD for lower inside temperature of the semiconductor memory device.

Meanwhile, the threshold voltage of the MOS transistor would be lowered when the inside temperature of the semiconductor memory device becomes higher. Hence, the level transition of the power-up signal from low to high must be performed at a lower voltage level of the external voltage (VDD) as the inside temperature of the semiconductor device becomes lower. However, the low to high level transition of the power-up signal at a lower voltage level of the external voltage (VDD) when the inside temperature of the semiconductor memory device is high could cause malfunction to the initialization operation of the semiconductor memory device such that the initialization operation cannot be correctly performed.

SUMMARY

An embodiment of the present invention relates to a power-up signal generation circuit which is capable of stably performing an initialization operation of a semiconductor memory device, without errors, by generating a power-up signal changing at a level of an external voltage, which varies depending on temperature, at low temperature, and changing at a constant level of an external voltage at high temperature.

In one embodiment, a power-up signal generation circuit includes: a fixed level transition voltage generation unit configured to generate a fixed level transition voltage changing at a constant level of an external voltage; a variable level transition voltage generation unit configured to generate a variable level transition voltage changing at a level of an external voltage which varies depending on temperature; a comparison unit configured to compare the level of the fixed level transition voltage with the level of the variable level transition voltage, and generate a selection signal; and a selective output unit configured to output the fixed level transition voltage or the variable level transition voltage as a power-up signal in response to the selection signal.

BRIEF DESCRIPTION OF THE DRAWINGS

The above and other aspects, features, and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
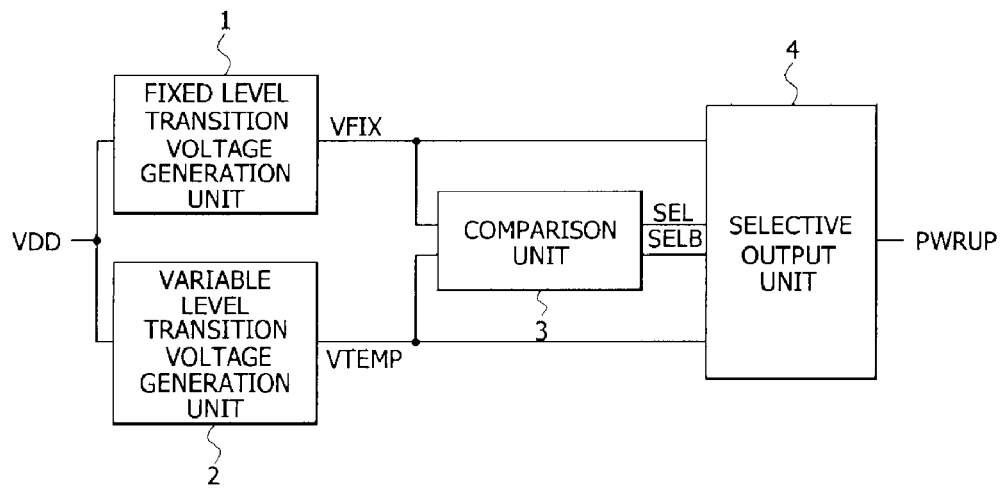
FIG. 1 is a block diagram illustrating the configuration of a power-up signal generation circuit according to an embodiment of the present invention.

FIG. 1 is a block diagram illustrating the configuration of a power-up signal generation circuit according to an embodiment of the present invention.

As illustrated in FIG. 1, the power-up signal generation circuit according to an embodiment of the present invention includes a fixed level transition voltage generation unit 1, a variable level transition voltage generation unit 2, a comparison unit 3, and a selective output unit 4.

Figure 2:
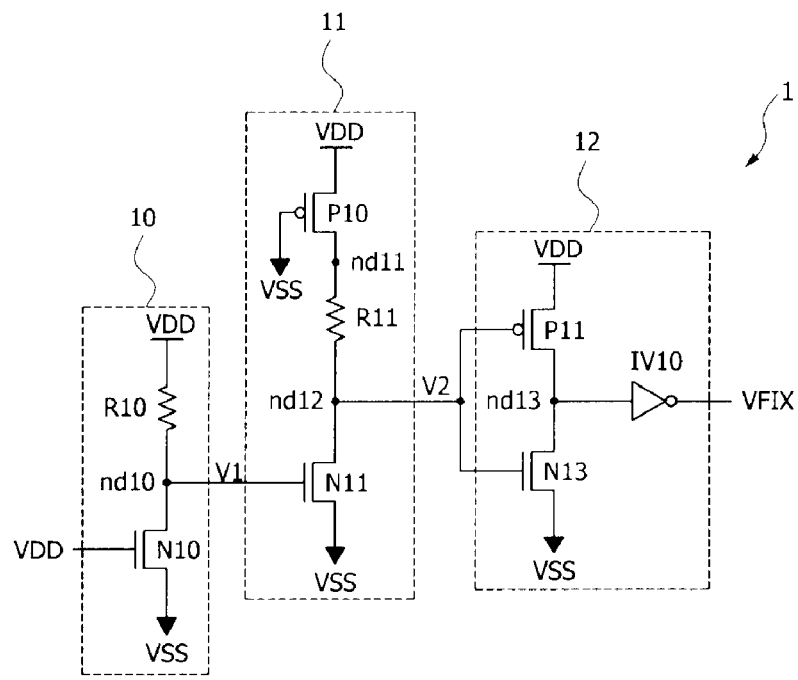
FIG. 2 is a circuit diagram of a fixed level transition voltage generation unit included in the power-up signal generation circuit of FIG. 1.

As illustrated in FIG. 2, the fixed level transition voltage generation unit 1 includes a first voltage generation section 10, a second voltage generation section 11, and a buffer section 12. Specifically, the first voltage generation section 10 includes a resistor R10 and an NMOS transistor N10. The resistor R10 is coupled between an external voltage (VDD) terminal and a node nd10 through which a first voltage V1 is outputted. The NMOS transistor N10 is coupled between the node nd10 and a ground voltage (VSS) terminal, and configured to operate as a pull-down element which pulls down the node nd10 in response to an external voltage VDD. The second voltage generation section 11 includes a PMOS transistor P10, a resistor R11, and an NMOS transistor N11. The PMOS transistor P10 is coupled between the external voltage (VDD) terminal and a node nd11, and configured to be turned on in response to a ground voltage VSS to thereby operate as a resistor. The resistor R11 is coupled between the node nd11 and a node 12 through which a second voltage V2 is outputted. The NMOS transistor N11 is coupled between the node nd12 and the ground voltage (VSS) terminal, and configured to operate as a pull-down element which pulls down the node nd12 in response to the first voltage V1. The buffer section 12 includes a PMOS transistor P11, an NMOS transistor N13, and an inverter IV10. The PMOS transistor P11 is configured to pull up a node nd13 in response to the second voltage V2. The NMOS transistor N13 is configured to pull down the node nd13 in response to the second voltage V2. The inverter IV10 is configured to invert and buffer a signal of the node nd13. The NMOS transistor N13 may be formed to be larger in size than the PMOS transistor P11. The fixed level transition voltage generation unit 1 configured as above generates a fixed level transition voltage VFIX, which changes from a low level to a high level at a constant voltage level of the external voltage VDD regardless of temperature fluctuations inside the semiconductor device.

Figure 3:
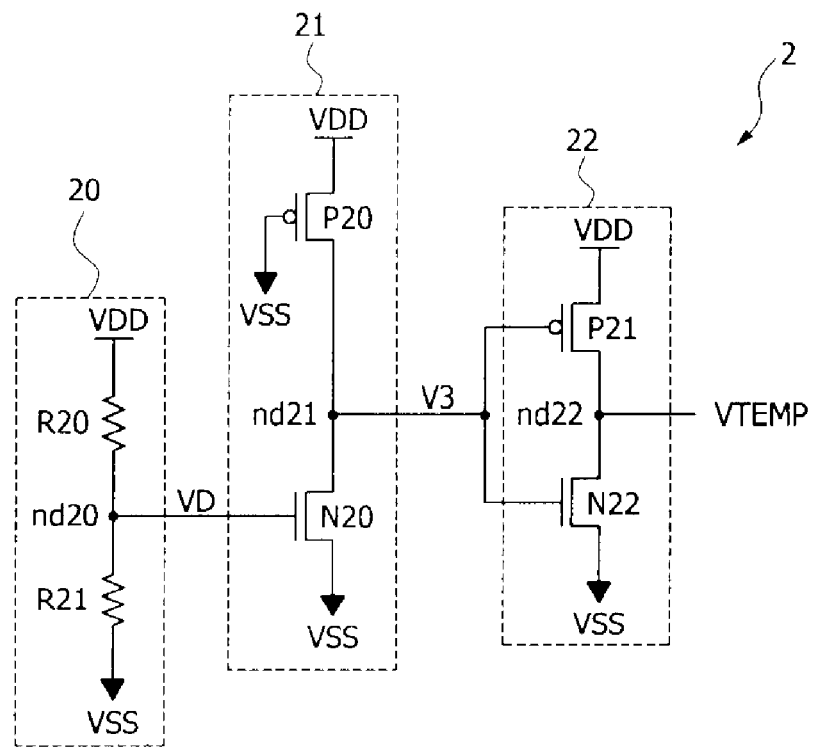
FIG. 3 is a circuit diagram of a variable level transition voltage generation unit included in the power-up signal generation circuit of FIG. 1.

As illustrated in FIG. 3, the variable level transition voltage generation unit 2 includes a voltage division section 20, a third voltage generation section 21, and a buffer section 22. Specifically, the voltage division section 20 includes a resistor R20 and a resistor R21. The resistor R20 is coupled between the external voltage (VDD) terminal and a node nd20 through which a division voltage VD is outputted. The resistor R21 is coupled between the node nd20 and the ground voltage (VSS) terminal. The third voltage generation section 21 includes a PMOS transistor P20 and an NMOS transistor N20. The PMOS transistor P20 is coupled between the external voltage (VDD) terminal and a node nd21 through which a third voltage V3 is outputted, and configured to be turned on in response to the ground voltage VSS to thereby operate as a resistor. The NMOS transistor N20 is coupled between the node nd21 and the ground voltage (VSS) terminal, and configured to pull down the node nd21 in response to the division voltage VD. The buffer section 22 includes a PMOS transistor P21 and an NMOS transistor N22. The PMOS transistor P21 is configured to pull up a node nd22 in response to the third voltage V3, and the NMOS transistor N22 is configured to pull down the node nd22 in response to the third voltage V3. The NMOS transistor N22 may be formed to be larger in size than the PMOS transistor P21. The variable level transition voltage generation unit 2 configured as above generates a variable level transition voltage VTEMP, which would changes from a low level to a high level at a higher voltage level than the constant voltage level of the external voltage VDD as the temperature inside the semiconductor device becomes lower. These will be described in more detail below with respect to FIG. 6.

Figure 4:
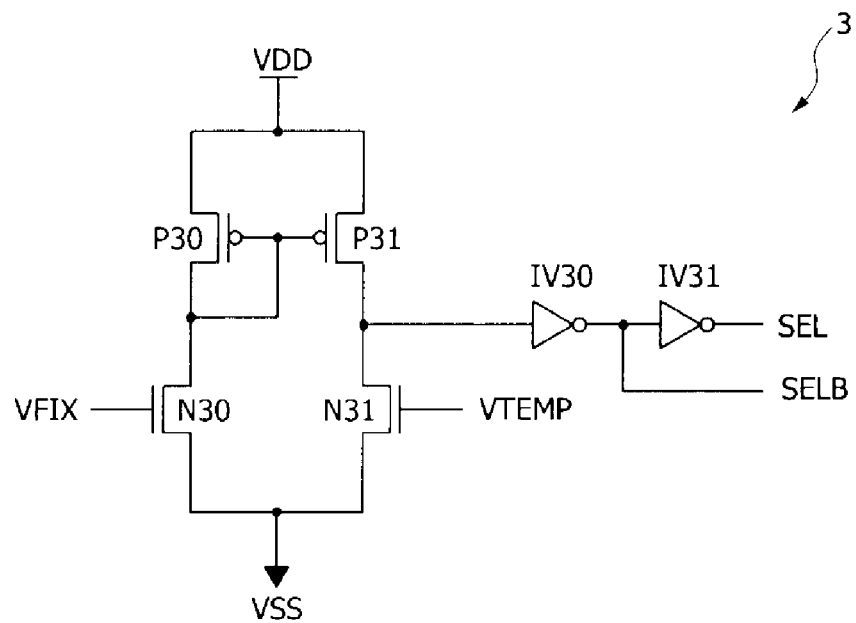
FIG. 4 is a circuit diagram of a comparison unit included in the power-up signal generation circuit of FIG. 1.

As illustrated in FIG. 4, the comparison unit 3 includes PMOS transistors P30 and P31 forming a current mirror, an NMOS transistor N30 receiving the fixed level transition voltage VFIX, an NMOS transistor N31 receiving the variable level transition voltage VTEMP, and inverters IV30 and IV31. The comparison unit 3 is implemented with a differential amplifier circuit, and generates a selection signal SEL of a high level and an inverted selection signal SELB of a low level when the level of the fixed level transition voltage VFIX is higher than the level of the variable level transition voltage VTEMP, and generates the selection signal SEL of a low level and the inverted selection signal SELB of a high level when the level of the fixed level transition voltage VFIX is lower than the level of the variable level transition voltage VTEMP.

Figure 5:
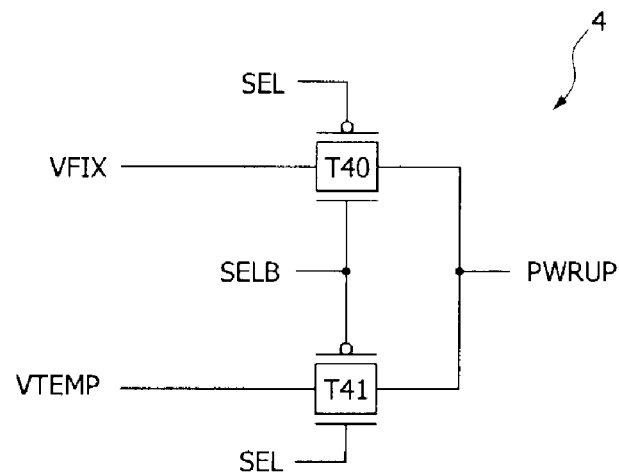
FIG. 5 is a circuit diagram of a selective output unit included in the power-up signal generation circuit of FIG. 1.

As illustrated in FIG. 5, the selective output unit 4 includes a transfer gate T40 and a transfer gate T41. Specifically, the transfer gate T40 is configured to transfer the fixed level transition voltage VFIX as a power-up signal PWRUP in response to the selection signal SEL and the inverted selection signal SELB, and the transfer gate T41 is configured to transfer the variable level transition voltage VTEMP as the power-up signal PWRUP in response to the selection signal SEL and the inverted selection signal SELB. The selective output unit 4 configured as above outputs the variable level transition voltage VTEMP as the power-up signal PWRUP when the selection signal SEL of a high level and the inverted selection signal SELB of a low level are inputted thereto, and outputs the fixed level transition voltage VFIX as the power-up signal PWRUP when the selection signal SEL of a low level and the inverted selection signal SELB of a high level are inputted thereto.

The operation of the power-up signal generation circuit configured as above will be described below in detail with reference to FIGS. 2 to 6.

First, the first voltage generation section 10 of the fixed level transition voltage generation unit 1 as illustrated in FIG. 2 detects the level of the external voltage VDD and generates the first voltage V1. The first voltage V1 rises along the level of the external voltage VDD when the level of the external voltage VDD is lower than the threshold voltage of the NMOS transistor N10, and the first voltage V1 is pulled down when the level of the external voltage VDD is higher than the threshold voltage of the NMOS transistor N10. At this time, the peak voltage of the first voltage V1 (the maximum voltage which has risen along the level of the external voltage VDD before the first voltage V1 is pulled down) increases in inverse proportion to temperature. This is caused by temperature characteristics of the resistor R10 and the NMOS transistor N10. That is, the resistance of the resistor R10 decreases as the temperature becomes lower, and the turn-on resistance of the NMOS transistor N10 increases as the temperature becomes lower. Thus, as the temperature becomes lower, the first voltage V1 outputted through the node nd10 rises up to a high peak voltage and then is pulled down.

Next, the second voltage generation section 11 of the fixed level transition voltage generation unit 1 as illustrated in FIG. 2 generates the second voltage V2 which changes from the constant level of the external voltage VDD to the high level, regardless of temperature. The reason why the second voltage V2 changes from the constant level of the external voltage VDD to the high level is that the variation in the peak voltage of the first voltage V1 is offset by the variation in the resistance of the resistor R11 according to temperature. Therefore, the second voltage V2 outputted from the node nd12 changes from the constant level of the external voltage VDD to the high level, regardless of temperature.

Figure 6:
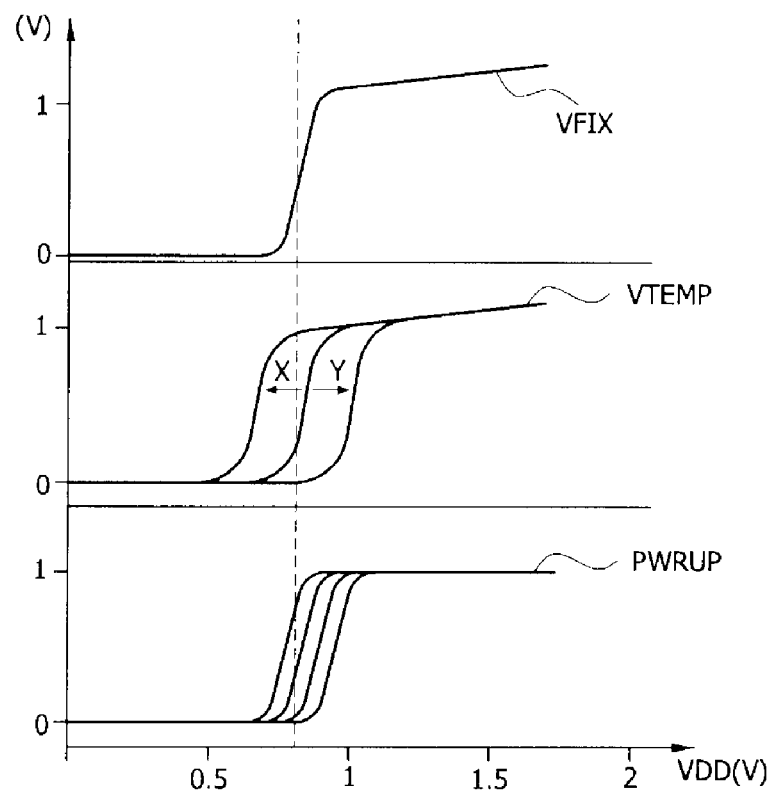
FIG. 6 is a timing diagram illustrating a level change of a variable level transition voltage generated from a variable level transition voltage generation unit shown in FIG. 2.

Next, the buffer section 12 of the fixed level voltage transition generation unit 1 as illustrated in FIG. 2 buffers the second voltage V2 and outputs the fixed level transition voltage VFIX. Therefore, as schematically shown in FIG. 6, the fixed level transition voltage VFIX changes from the level of the external voltage VDD to the high level, regardless of temperature.

Meanwhile, the voltage division section 20 of the variable level transition voltage generation unit 2 as illustrated in FIG. 3 divides the external voltage VDD and generates the division voltage VD. Since the characteristics of the resistors R20 and R21 included in the voltage division section 20 equally change depending on temperature, the level of the division voltage VD does not change depending on temperature. Therefore, the division voltage VD outputted from the voltage division section 20 increases linearly along the level of the external voltage VDD.

Next, the third voltage generation section 21 of the variable level transition voltage generation unit 2 as illustrated in FIG. 3 generates the third voltage V3 which changes from the higher level of the external voltage VDD to the low level as the temperature becomes lower, and changes from the lower level of the external voltage VDD to the low level as the temperature becomes higher, according to the temperature-dependent characteristic variation of the NMOS transistor N20. That is, since the turn-on resistance of the NMOS transistor N20 increases as the temperature becomes lower, the external voltage VDD must reach a higher level at a lower temperature so that the NMOS transistor N20 can be turned on to pull down the third voltage V3.

Next, the buffer section 22 of the variable level transition voltage generation unit 2 as illustrated in FIG. 2 inverts and buffers the third voltage V3 and generates the variable level transition voltage VTEMP. Therefore, as schematically shown in FIG. 6, the variable level transition voltage VTEMP changes from the lower level of the external voltage VDD to the high level as the temperature becomes higher, as indicated by "X", and the variable level transition voltage VTEMP changes from the higher level of the external voltage VDD to the high level as the temperature becomes lower, as indicated by "Y".

Next, the comparison unit 3 as illustrated in FIG. 4 compares the level of the fixed level transition voltage VFIX with the level of the variable level transition voltage VTEMP, and generates the selection signal SEL and the inverted selection signal SELB. The comparison unit 3 generates the selection signal SEL of a high level and the inverted selection signal SELB of a low level at low temperature, and generates the selection signal SEL of a low level and the inverted selection signal SELB of a high level at high temperature. This is because the variable level transition voltage VTEMP changes from the level of the external voltage VDD higher than the level of the fixed level transition voltage VFIX to the high level at low temperature, and changes from the level of the external voltage VDD lower than the level of the fixed level transition voltage VFIX to the high level at high temperature.

Next, the selective output unit 4 as illustrated in FIG. 5 outputs the variable level transition voltage VTEMP or the fixed level transition voltage VFIX as the power-up signal PWRUP in response to the selection signal SEL and the inverted selection signal SELB. More specifically, at low temperature, the transfer gate T41 is turned on in response to the selection signal SEL of a high level and the inverted selection signal SELB of a low level, so that the variable level transition voltage VTEMP is outputted as the power-up signal PWRUP. Also, at high temperature, the transfer gate T40 is turned on in response to the selection signal SEL of a low level and the inverted selection signal SELB of a high level, so that the fixed level transition voltage VFIX is outputted as the power-up signal PWRUP. Therefore, the fixed level transition voltage VFIX is outputted at high temperature, and thus the power-up signal PWRUP changes from the constant level of the external voltage VDD to the high level. On the other hand, the variable level transition voltage VTEMP is outputted at low temperature, and thus the level of the external voltage VDD changing to the high level increases as the inside temperature becomes lower.

In summary, the power-up signal generation circuit according to an embodiment of the present invention generates the power-up signal PWRUP changing from a higher level of the external voltage VDD to a high level as the inside temperature becomes lower, thereby achieving a stable operation even though the threshold voltage of the MOS transistor becomes high. Meanwhile, the power-up signal generation circuit according to an embodiment of the present invention generates the power-up signal PWRUP changing from a constant level of the external voltage VDD to a high level, even though the inside temperature is high, in order to substantially prevent malfunction occurring when the initialization operation is early stopped.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A power-up signal generation circuit comprising:
   a fixed level transition voltage generation unit configured to generate a fixed level transition voltage at a level of an external voltage;
   a variable level transition voltage generation unit configured to generate a variable level transition voltage at levels of the external voltage depending on the temperature;
   a comparison unit configured to compare the level of the fixed level transition voltage with the level of the variable level transition voltage and generate a selection signal; and
   a selective output unit configured to output the fixed level transition voltage or the variable level transition voltage as the power-up signal in response to the selection signal.

2. The power-up signal generation circuit of claim 1, wherein the fixed level transition voltage generation unit comprises:
   a first voltage generation section configured to generate a first voltage whose peak voltage is lowered as temperature increases; and
   a second voltage generation section configured to generate a second voltage changing with reference to the peak voltage of the first voltage.

3. The power-up signal generation circuit of claim 2, wherein the first voltage generation section comprises:
   a first resistor coupled between an external voltage terminal and a first node through which the first voltage is outputted; and
   a first pull-down element coupled between the first node and a ground voltage terminal, and configured to pull down the first node in response to the external voltage.

4. The power-up signal generation circuit of claim 3, wherein the second voltage generation section comprises:
   a MOS transistor coupled between the external voltage terminal and a second node, and configured to operate as a resistor;
   a second resistor coupled between the second node and a third node through which the second voltage is outputted; and
   a second pull-down element coupled between the third node and the ground voltage terminal, and configured to pull down the third node in response to the first voltage.

5. The power-up signal generation circuit of claim 2, wherein the fixed level transition voltage generation unit further comprises a buffer section configured to buffer the second voltage and generate the fixed level transition voltage.

6. The power-up signal generation circuit of claim 1, wherein the variable level transition voltage generation unit comprises:
   a voltage division section configured to divide the external voltage and generate a division voltage; and
   a first MOS transistor configured to pull down a first node in response to the division voltage.

7. The power-up signal generation circuit of claim 6, wherein the voltage division section comprises:

a first resistor coupled between a external voltage terminal and a second node through which the division voltage is outputted; and a second resistor coupled between the second node and a ground voltage terminal.

8. The power-up signal generation circuit of claim 7, wherein the voltage generation section comprises:

a second MOS transistor coupled between the external voltage and the first node, and configured to operate as a resistor; and a first MOS transistor coupled between the first node and the ground voltage terminal, and configured to pull down the first node in response to the division voltage.

9. The power-up signal generation circuit of claim 6, wherein the variable level transition voltage generation unit further comprises a buffer section configured to buffer a signal of the first node and generate the variable level transition voltage.

10. The power-up signal generation circuit of claim 1, wherein the comparison unit is configured to generate the selection signal of a first level when the level of the fixed level transition voltage is higher than the level of the variable level transition voltage, and generate the selection signal of a second level when the level of the fixed level transition voltage is lower than the level of the variable level transition voltage.

11. The power-up signal generation circuit of claim 10, wherein the selective output unit is configured to output the variable level transition voltage as the power-up signal when the selection signal is at the first level, and output the fixed level transition voltage as the power-up signal when the selection signal is at the second level.

12. A power-up signal generation circuit receiving an external voltage and outputs a power up signal in a semiconductor memory device having a logical component therein, wherein a high inside temperature of the semiconductor device causes lowered threshold voltage level of the logical component and wherein a low inside temperature of the semiconductor device causes increased threshold voltage level of the logical component, the power-up generation circuit comprising:

a fixed voltage generation unit configured to generate a fixed level transition voltage, wherein the fixed level transition voltage transitions from a first voltage level to a second voltage level higher than the first voltage level at a predetermined voltage level of the external voltage regardless;

a variable voltage generation unit configured to generate a variable level transition voltage, wherein the variable level transition voltage transitions from a third voltage level to a fourth voltage level higher than the third voltage level at a voltage level of the external device, which varies depending on the temperature fluctuations inside the semiconductor memory device, wherein the power-up signal is the fixed level transition voltage during the low inside temperature, and wherein the power-up signal generation circuit outputs the variable level transition voltage during the high inside temperature such that the transition from the third voltage to the fourth voltage occurs at a higher than the predetermined level of the external voltage.

13. The power-up signal generation circuit of claim 12, wherein the logical component is a MOS transistor.

14. The power-up signal generation circuit of claim 12, wherein the first and third voltages are substantially same.

15. The power-up signal generation circuit of claim 14, wherein the second and fourth voltages are substantially same.

16. The power-up signal generation circuit of claim 12, further comprising:

a comparison circuit configured to compare the voltage levels of the fixed level transition voltage and the variable level transition voltage and determine the low inside temperature when the fixed level transition voltage is higher than the variable level transition voltage or determine the high inside temperature when the fixed level voltage is lower than the variable level transition voltage.

* * * * *